(12) United States Patent
Son et al.

(10) Patent No.: US 8,853,807 B2
(45) Date of Patent: Oct. 7, 2014

(54) MAGNETIC DEVICES AND METHODS OF FABRICATING THE SAME

(75) Inventors: Jongpil Son, Seongnam-si (KR); Sangbeom Kang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 13/479,337

(22) Filed: May 24, 2012

(65) Prior Publication Data

US 2012/0299133 A1   Nov. 29, 2012

(30) Foreign Application Priority Data

May 24, 2011   (KR) .................. 10-2011-0048963

(51) Int. Cl.
*H01L 29/82* (2006.01)
*H01L 43/08* (2006.01)

(52) U.S. Cl.
CPC ............... *H01L 43/08* (2013.01); *H01L 29/82* (2013.01)
USPC ................... 257/421; 257/E29.323; 257/427; 365/157; 360/324.2

(58) Field of Classification Search
USPC .......... 257/421–422, 427, E29.323; 365/157, 365/171, 360, 324.2
See application file for complete search history.

(56) References Cited

U.S. PATENT DOCUMENTS

| 6,281,538 | B1 * | 8/2001 | Slaughter ..................... 257/295 |
| 2010/0219492 | A1 | 9/2010 | Roiz Wilson |
| 2010/0304185 | A1 * | 12/2010 | Zhao et al. ................ 428/811.1 |

FOREIGN PATENT DOCUMENTS

| JP | 2000-357829 | 12/2000 |
| JP | 2006-352147 | 12/2006 |
| JP | 2007-019179 | 1/2007 |

* cited by examiner

*Primary Examiner* — Matthew W Such
*Assistant Examiner* — Ali Naraghi
(74) *Attorney, Agent, or Firm* — Renaissance IP Law Group LLP

(57) ABSTRACT

Magnetic devices and methods of fabricating the same are provided. According to the magnetic device, a tunnel barrier pattern is interposed between a first magnetic pattern and a second magnetic pattern. An edge portion of the tunnel barrier pattern is thicker than a central portion of the tunnel barrier pattern. The central portion of the tunnel barrier pattern has a substantially uniform thickness.

12 Claims, 17 Drawing Sheets

MAGNETIC DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0048963, filed on May 24, 2011, the entirety of which is incorporated by reference herein.

BACKGROUND

The present disclosure herein relates to semiconductor devices and methods of fabricating the same and, more particularly, to magnetic devices and methods of fabricating the same.

As faster and lower power consuming electronic devices are desired, semiconductor memory devices used therein also need to have a faster read/write operation and/or a lower operating voltage. As one plan to satisfy one or more of the above requirements, a magnetic memory device has been proposed as a semiconductor memory device. Since the magnetic memory device operates at higher speed and has a nonvolatile characteristic, it has drawn attention as a next generation memory device.

A magnetic memory device may include two magnetic layers, e.g., a free layer and a fixed layer (or a reference layer), separated by a nonmagnetic spacer layer or an insulating barrier layer. A resistance value of the two magnetic layers may vary depending on magnetization directions of the two magnetic layers. For example, when magnetization directions of the two magnetic layers are parallel to each other, the two magnetic layers may have a relatively small resistance value. Alternatively, when magnetization directions of the two magnetic layers are anti-parallel to each other, the two magnetic layers may have a relatively large resistance value. The magnetic memory device may be used to write/read data by using a difference between the resistance values.

SUMMARY

Example embodiments of inventive concepts may provide a magnetic device such as a magnetic memory device having improved reliability and a method of fabricating the same.

Example embodiments of inventive concepts may also provide a magnetic device reducing power consumption and a method of fabricating the same.

Example embodiments of inventive concepts may also provide a magnetic device with increased integration density and a method of fabricating the same.

In example embodiments of the inventive concepts, a magnetic device may include a first magnetic pattern and a second magnetic pattern disposed on a substrate; and a tunnel barrier pattern interposed between the first magnetic pattern and the second magnetic pattern. An edge portion of the tunnel barrier pattern is thicker than a central portion of the tunnel barrier pattern, and the central portion of the tunnel barrier pattern may have a substantially uniform thickness.

In some embodiments, the magnetic memory device may further include a residual capping pattern interposed between the central portion of the tunnel barrier pattern and the second magnetic pattern.

In other embodiments, the residual capping pattern may be made of metal, and the tunnel barrier pattern may include metal oxide. The metal oxide in the tunnel barrier pattern may include the same metal as the residual capping pattern.

In still other embodiments, the first magnetic pattern, the tunnel barrier pattern and the second magnetic pattern may be sequentially stacked. In this case, a top surface of the edge portion of the tunnel barrier pattern may be disposed at a level higher than a top surface of the central portion of the tunnel barrier pattern, and a bottom surface of the edge portion of the tunnel barrier pattern may be substantially coplanar with a bottom surface of the central portion of the tunnel barrier pattern.

In yet other embodiments, a maximum thickness of the edge portion of the tunnel barrier pattern may be equal to or less than about five times a thickness of the central portion of the tunnel barrier pattern.

In yet still other embodiments, wherein one of the first and second magnetic patterns may have a fixed magnetization direction in one direction, and the other of the first and second magnetic patterns may have a magnetization direction switchable between parallel to and anti-parallel to the fixed magnetization direction.

In further embodiments, the magnetization directions of the first and second magnetic patterns may be substantially horizontal to a surface of the tunnel barrier pattern, which is adjacent to the first magnetic pattern.

In still further embodiments, the magnetization directions of the first and second magnetic patterns may be substantially perpendicular to a surface of the tunnel barrier pattern, which is adjacent to the first magnetic pattern.

In other example embodiments of the inventive concepts, a method of fabricating a magnetic memory device may include forming a first magnetic layer on a substrate; forming a base-barrier layer on the first magnetic layer; sequentially forming a capping layer and a second magnetic layer on the base-barrier layer; successively patterning the second magnetic layer, the capping layer, the base-barrier layer and the first magnetic layer to form a first magnetic pattern, a base-barrier pattern, a capping pattern and a second magnetic pattern sequentially stacked; and oxidizing an edge portion of the capping pattern to form a tunnel barrier pattern.

In some embodiments, a central portion of the capping pattern disposed at a side of the edge portion of the capping pattern may remain without being oxidized, and the tunnel barrier pattern may include the base-barrier pattern and the oxidized edge portion of the capping pattern.

In other embodiments, forming the base-barrier layer may include forming a base-metal layer on the first magnetic layer; and oxidizing the base-metal layer.

In still other embodiments, the base-barrier layer may be formed using at least one of a chemical vapor deposition (CVD) process and an atomic layer deposition (ALD) process.

BRIEF DESCRIPTION OF THE DRAWINGS

The inventive concept will become more apparent in view of the attached drawings and accompanying detailed description, wherein.

DETAILED DESCRIPTION OF THE EMBODIMENTS

Figure 1:
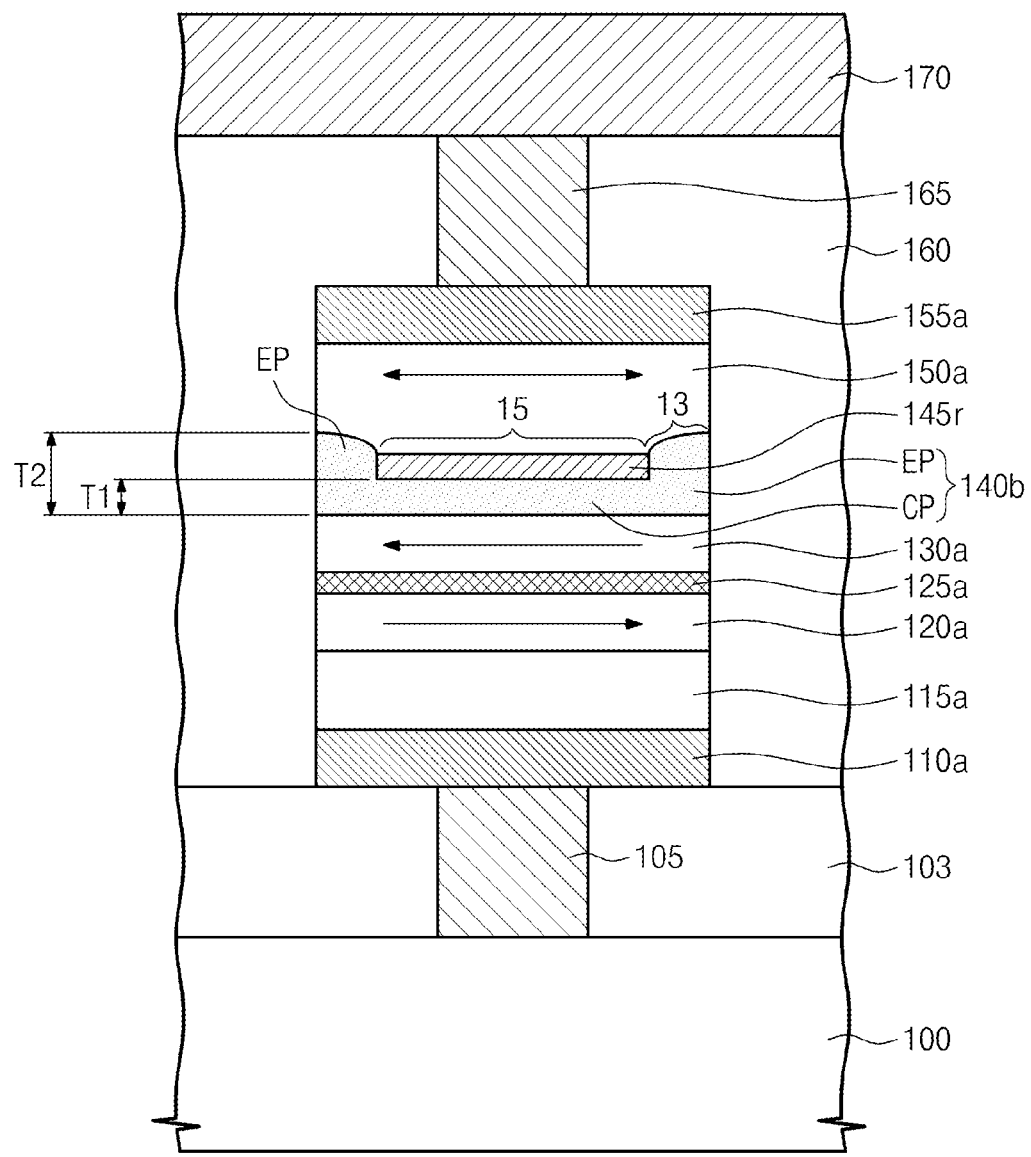
FIG. 1 is a cross sectional view illustrating a magnetic memory device according to an embodiment of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," an and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a cross sectional view illustrating a magnetic memory device according to an embodiment of the inventive concept.

Referring to FIG. 1, a lower interlayer dielectric 103 may be disposed on a substrate 100. The substrate 100 may include a switching component (not shown). For example, the switching component may be a field effect transistor or a PN junction diode, etc. The lower interlayer dielectric 103 may cover the switching component. The lower interlayer dielectric 103 may include oxide (e.g., silicon oxide), nitride (e.g., silicon nitride) and/or oxynitride (e.g., silicon oxynitride). A lower contact plug 105 may penetrate the lower interlayer dielectric 103. The lower contact plug 105 may be electrically connected to one terminal of the switching component. For example, the lower contact plug 105 may include at least one of a semiconductor doped with dopant (e.g., doped silicon, etc), metal (e.g., tungsten, etc), a conductive metal nitride (e.g., titanium nitride, tantalum nitride, etc), a metal-semiconductor compound (e.g., a metal silicide, etc) and a transition metal (e.g., titanium, tantalum, etc).

A reference magnetic pattern 130*a* and a free magnetic pattern 150*a* may be disposed on the lower interlayer dielectric 103. A tunnel barrier pattern 140*b* may be interposed between the reference magnetic pattern 130*a* and the free magnetic pattern 150*a*. The reference magnetic pattern 130*a*, the tunnel barrier pattern 140*b* and the free magnetic pattern 150*a* may be included in a magnetic tunnel junction (MTJ) pattern.

In an embodiment, as illustrated in FIG. 1, the reference magnetic pattern 130*a*, the tunnel barrier pattern 140*b* and the free magnetic pattern 150*a* may be sequentially stacked on the lower interlayer dielectric 103. The reference magnetic pattern 130a may have a fixed magnetization direction in one direction. The free magnetic pattern 150a may have a magnetization direction switchable between a direction parallel to and anti-parallel to the fixed magnetization direction of the reference magnetic pattern 130a. The free magnetic pattern 150a may have a sidewall self-aligned with a sidewall of the reference magnetic pattern 130a.

The tunnel barrier pattern 140b includes a central portion CP and an edge portion EP. The edge portion EP of the tunnel barrier pattern 140b is thicker than the central portion CP of the tunnel barrier pattern 140b. In the embodiment shown in FIG. 1, the central portion CP of the tunnel barrier pattern 140b may have a substantially uniform thickness. As a position of the edge portion EP moves from an outer sidewall of the edge portion EP toward the central portion CP, a thickness of the edge portion EP may be substantially reduced. A minimum thickness of the edge portion EP may be thicker than the thickness of the central portion CP.

In an embodiment, a top surface of the edge portion EP may be disposed at a level higher than a top surface of the central portion CP with respect to a top surface of the substrate 100. A bottom surface of the edge portion EP may be substantially coplanar with a bottom surface of the central portion CP.

In an embodiment, the thickness T1 of the central portion CP of the tunnel barrier pattern 140b may be less than a spin diffusion distance. The spin diffusion distance may be a distance over which electrons remains polarized. That is, the spin diffusion distance may be a distance that electrons can move without changing spin directions of the electrons. For example, the thickness T1 of the central portion CP of the tunnel barrier pattern 140b may have a range of about 1 angstrom to about 10 angstrom, however, the inventive concept is not limited thereto.

As described above, the thickness of the edge portion EP of the tunnel barrier pattern 140b is thicker than the thickness T1 of the central portion CP. In an embodiment, the minimum thickness of the edge portion EP of the tunnel barrier pattern 140b may be greater than the spin diffusion distance. A maximum thickness T2 of the edge portion EP of the tunnel barrier pattern 140b may be equal to or less than about five times the thickness T1 of the central portion CP of the tunnel barrier pattern 140b, however, the inventive concept is not limited thereto.

The tunnel barrier pattern 140b may include metal oxide. For example, the tunnel barrier pattern 140b may include at least one of magnesium oxide, titanium oxide, aluminum oxide and magnesium-zinc oxide.

A residual capping pattern 145r may be interposed between the central portion CP of the tunnel barrier pattern 140b and the free magnetic pattern 150a. The residual capping pattern 145r may be in contact with a top surface of the central portion CP of the tunnel barrier pattern 140b. In an embodiment, the residual capping pattern 145r may be in contact with a bottom surface of the free magnetic pattern 150a. The top surface of the edge portion EP of the tunnel barrier pattern 140b may be disposed at a level higher than a top surface of the residual capping pattern 145r. The bottom surface of the free magnetic pattern 150a overlying the tunnel barrier pattern 140b may include a first portion 15 and a second portion 13. The first portion 15 of the bottom surface of the free magnetic pattern 150a may be disposed over the top surface of the central portion CP, and the second portion 13 of the bottom surface of the free magnetic pattern 150a may be disposed over the top surface of the edge portion EP. In this case, the second portion 13 of the bottom surface of the free magnetic pattern 150a may be disposed at a level higher than the first portion 15 of the bottom surface of the free magnetic pattern 150a.

In some embodiments, a top surface of the edge portion EP is tapered toward the central portion CP of the tunnel barrier pattern 140b.

In some embodiments, the residual capping pattern 145r may be removed.

The residual capping pattern 145r may include metal. For example, the residual capping pattern 145r may be made of the metal. In an embodiment, the metal in the residual capping pattern 145r may be the same as a metal in the metal oxide of the tunnel barrier pattern 140b. For example, when the tunnel barrier pattern 140b includes magnesium oxide, the residual capping pattern 145r may include magnesium. Referring to FIG. 1, the magnetization directions of the reference magnetic pattern 130a and the free magnetic pattern 150a may be substantially parallel to the bottom surface of the tunnel barrier pattern 140b. A pinning pattern 115a may be disposed between the reference magnetic pattern 130a and the lower interlayer dielectric 103. A reference supplementary magnetic pattern 120a may be disposed between the pinning pattern 115a and the reference magnetic pattern 130a. An exchange coupling pattern 125a may be disposed between the reference supplementary magnetic pattern 120a and the reference magnetic pattern 130a. The pinning pattern 115a, the reference supplementary magnetic pattern 120a, the exchange coupling pattern 125a, the reference magnetic pattern 130a, the tunnel barrier pattern 140b, the residual capping pattern 145r and the free magnetic pattern 150a may be sequentially stacked on the lower interlayer dielectric 103. The reference supplementary magnetic pattern 120a, the exchange coupling pattern 125a, the reference magnetic pattern 130a may be referred to as a synthetic antiferromagnetic (SAF) structure.

Due to the pinning pattern 130a, the magnetization direction of the reference magnetic pattern 130a may be fixed in one direction. For example, a magnetization direction of the reference supplementary magnetic pattern 120a may be fixed by the pinning pattern 115a. The magnetization direction of the reference magnetic pattern 130a may be fixed to be anti-parallel to the magnetization direction of the reference supplementary magnetic pattern 120a by the exchange coupling pattern 125a. The pinning pattern 115a may include an anti-ferromagnetic material. For example, the pinning pattern 115a may include at least one of PtMn, IrMn, MnO, MnS, MnTe or MnF. The exchange coupling pattern 125a may include a rare transition metal. For example, the exchange coupling pattern 125a may include at least one of Ru, Ir and Rh.

The reference magnetic pattern 130a may include a ferromagnetic material. For example, the reference magnetic pattern 130a may include at least one of CoFeB, CoFe, NiFe or CoFeNi. The free magnetic pattern 150a may include a ferromagnetic material. For example, the free magnetic pattern 150a may include at least one of CoFeB, CoFe, NiFe or CoFeNi. The reference supplementary magnetic pattern 120a may also include a ferromagnetic material. For example, the reference supplementary magnetic pattern 120a may include at least one of CoFeB, CoFe, NiFe or CoFeNi. In an embodiment, the reference magnetic pattern 130a, the free magnetic pattern 150a and the reference magnetic pattern 120a may include the same ferromagnetic material as each other, or ferromagnetic materials different from each other.

In an embodiment, the reference supplementary magnetic pattern 120a and the exchange coupling pattern 125a may be omitted. In this case, the reference magnetic pattern 130a may be in contact with the pinning pattern 115a. Also, in some embodiments, the pinning pattern 115a may be omitted.

A first electrode 110a may be disposed between the pinning pattern 115a and the lower interlayer dielectric 103. The first electrode 110a may be connected to the lower contact plug 105. As a result, the MTJ pattern may be electrically coupled to the switching component such as a field effect transistor or a PN junction diode, as discussed above. A second electrode 155a may be disposed on the free magnetic pattern 150a. The first and second electrodes 110a and 155a may include a conductive material. For example, the first and second electrodes 110a and 155a may include a conductive metal nitride such as titanium nitride or tantalum nitride, etc. The first and second electrodes 110a and 155a may include the same conductive material as each other, or conductive materials different from each other.

An upper interlayer dielectric 160 may be disposed on substantially the entire surface of the substrate 100 including the second electrode 155a and the MTJ pattern. An upper contact plug 165 may penetrate the upper interlayer dielectric 160 to be connected to the second electrode 155a. An interconnection 170 may be disposed on the upper interlayer dielectric 160 to be connected to the upper contact plug 165. The interconnection 170 may correspond to a bit line.

An operation method of the magnetic memory device will be described. The magnetization direction of the free magnetic pattern 150a may be switchable by a spin transfer torque technique. That is, the magnetization direction of the free magnetic pattern 150a may be switchable by spin torques of electrons in a program current transferred through the MTJ pattern. The free magnetic pattern 150a may be switchable between a plurality of stable magnetic states, for example, when a write current is passed through the magnetic memory device. For example, when the magnetization direction of the free magnetic pattern 150a is anti-parallel to the magnetization direction of the reference magnetic pattern 130a, the program current may be provided from the free magnetic pattern 150a toward the reference magnetic pattern 130a. That is, electrons in the program current may be provided from the reference magnetic pattern 130a toward the free magnetic pattern 150a. Electrons transferred through the reference magnetic pattern 130a may include first electrons and second electrons. The first electrons may have spins parallel to the magnetization direction of the reference magnetic pattern 130a, and the second electrons may have spins anti-parallel to the magnetization direction of the reference magnetic pattern 130a. The amount of the first electrons may be sufficiently more than the amount of the second electrons. The first electrons may be accumulated in the free magnetic pattern 150a. The magnetization direction of the free magnetic pattern 150a may be changed to be parallel to the magnetization direction of the reference magnetic pattern 130a by spin torques of the first electrons accumulated in the free magnetic pattern 150a.

Alternatively, when the magnetization direction of the free magnetic pattern 150a is parallel to the magnetization direction of the reference magnetic pattern 130a, the program current may be provided from the reference magnetic pattern 130a toward the free magnetic pattern 150a. That is, electrons in the program current may be provided from the free magnetic pattern 150a toward the reference magnetic pattern 130a. First electrons having spins parallel to the magnetization direction of the reference magnetic pattern 130a may be transferred through the reference magnetic pattern 130a. Second electrons having spins anti-parallel to the magnetization direction of the reference magnetic pattern 130a may be reflected due to the magnetization direction of the reference magnetic pattern 130a. The reflected second electrons may be accumulated in the free magnetic pattern 150a. The magnetization direction of the free magnetic pattern 150a may be changed to be anti-parallel to the magnetization direction of the reference magnetic pattern 130a by the second electrons accumulated in the free magnetic pattern 150a.

As described above, the edge portion EP of the tunnel barrier pattern 140b is thicker than the central portion CP of the tunnel barrier pattern 140b. Therefore, the amount of electrons through the edge portion EP of the tunnel barrier pattern 140b can be minimized. As a result, the magnetic memory device having improved reliability can be realized.

An edge domain of a MTJ pattern may be rough by a factor such as a patterning process for defining the MTJ pattern. Thus, it may be difficult to control spin directions of electrons passing through the edge domain of the MTJ pattern. For example, the spin directions of electrons passing through the edge domain of the MTJ may be non parallel and non anti-parallel with magnetization directions of the first and second substances or may be random. Thus, a magneto resistive (MR) ratio of the MTJ pattern may be reduced or a program current density for a program operation may be increased. However, according to various embodiments of the inventive concepts, because the edge portion EP of the tunnel barrier pattern 140b is thicker than the central portion CP of the tunnel barrier pattern 140b, the amount of electrons through the edge portion EP of the tunnel barrier pattern 140b can be substantially reduced. As a result, the magnetic memory device having improved reliability can be realized.

Additionally, the electrons in the program current can be substantially transferred through the central portion CP of the tunnel barrier pattern 140b. Therefore, a tunneling area of the electrons in the program current can be reduced, so that the program current density can be reduced. As a result, the magnetic memory device having lower power consumption and/or increased integration density can be realized.

Modified embodiments of the inventive concepts will be described with reference to the drawings hereinafter. In the modified embodiments, the same elements as described in the above embodiments will be denoted by the same reference numerals or the same reference designators.

According to the magnetic memory device in FIG. 1, the reference magnetic pattern 130a may be disposed under the tunnel barrier pattern 140b, and the free magnetic pattern 150a may be disposed on the tunnel barrier pattern 140b. Alternatively, the free magnetic pattern 150a and the reference magnetic pattern 130a may be disposed under and on the tunnel barrier pattern 140b, respectively. This modified embodiment will be described hereinafter with reference to FIG. 2 in more detail.

In some embodiments, all or substantially all of a top surface of the central portion CP of the tunnel barrier pattern 140b is substantially planar. In some embodiments, a top of the edge portion EP of the tunnel barrier pattern 140b may extend above a top of the central portion CP of the tunnel barrier pattern 140b.

Figure 2:
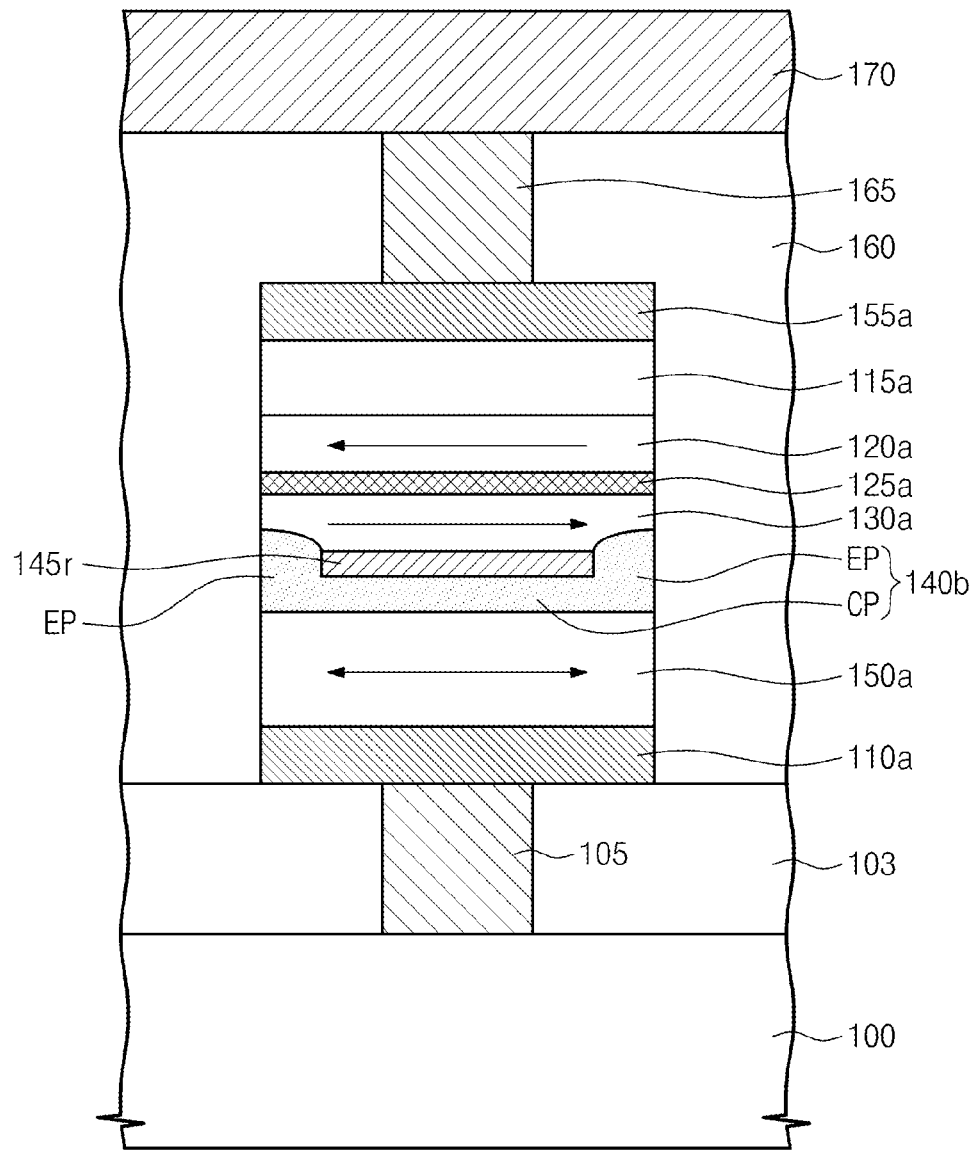
FIG. 2 is a cross sectional view illustrating a modified embodiment of a magnetic memory device according to an embodiment of the inventive concept.

FIG. 2 is a cross sectional view illustrating a modified embodiment of a magnetic memory device.

Referring to FIG. 2, the free magnetic pattern 150a having the switchable magnetization direction may be disposed between the bottom surface of the tunnel barrier pattern 140b and a top surface of the first electrode 110a. That is, the free magnetic pattern 150a may be disposed under the tunnel barrier pattern 140b. The reference magnetic pattern 130a having a fixed magnetization direction may be disposed on the top surface of the tunnel barrier pattern 140b. In the present modified embodiment, the residual capping pattern 145r may be disposed between the bottom surface of the reference magnetic pattern 130a and the top surface of the central portion CP of the tunnel barrier pattern 140b. The residual capping pattern 145r may be in contact with the bottom surface of the reference magnetic pattern 130a and the top surface of the central portion CP of the tunnel barrier pattern 140b.

The top surface of the edge portion EP of the tunnel barrier pattern 140b may be disposed at a level higher than the top surface of the residual capping pattern 145r. In the present modified embodiment, the bottom surface of the reference magnetic pattern 130a may include a first portion and a second portion. The first portion of the bottom surface of the reference magnetic pattern 130a may be disposed on the top surface of the residual capping pattern 145r, and the second portion of the bottom surface of the reference magnetic pattern 130a may be disposed on the top surface of an edge portion EP of the tunnel barrier pattern 140b. The second portion of the bottom surface of the reference magnetic pattern 130a may be disposed at a level higher than the first portion of the bottom surface of the reference magnetic pattern 130a. In the present modified embodiment, the bottom surface of the central portion CP of the tunnel barrier pattern 140b may also be substantially coplanar with the bottom surface of the edge portion EP.

In the present embodiment, as illustrated in FIG. 2, the exchange coupling pattern 125a, the reference supplementary magnetic pattern 120a, the pinning pattern 115a and the second electrode 155a may be sequentially stacked on a top surface of reference magnetic pattern 130a.

Although, as shown in FIGS. 1 and 2, the magnetization directions of the reference and free magnetic patterns 130a and 150a may be substantially parallel to one surface of the tunnel barrier pattern 140b (e.g., the top surface of the central portion CP), the inventive concept is not limited thereto. The magnetization directions of reference and free magnetic patterns may, for instance, be substantially perpendicular to one surface of the tunnel barrier pattern. This modified embodiment will be described hereinafter in more detail.

Figure 3:
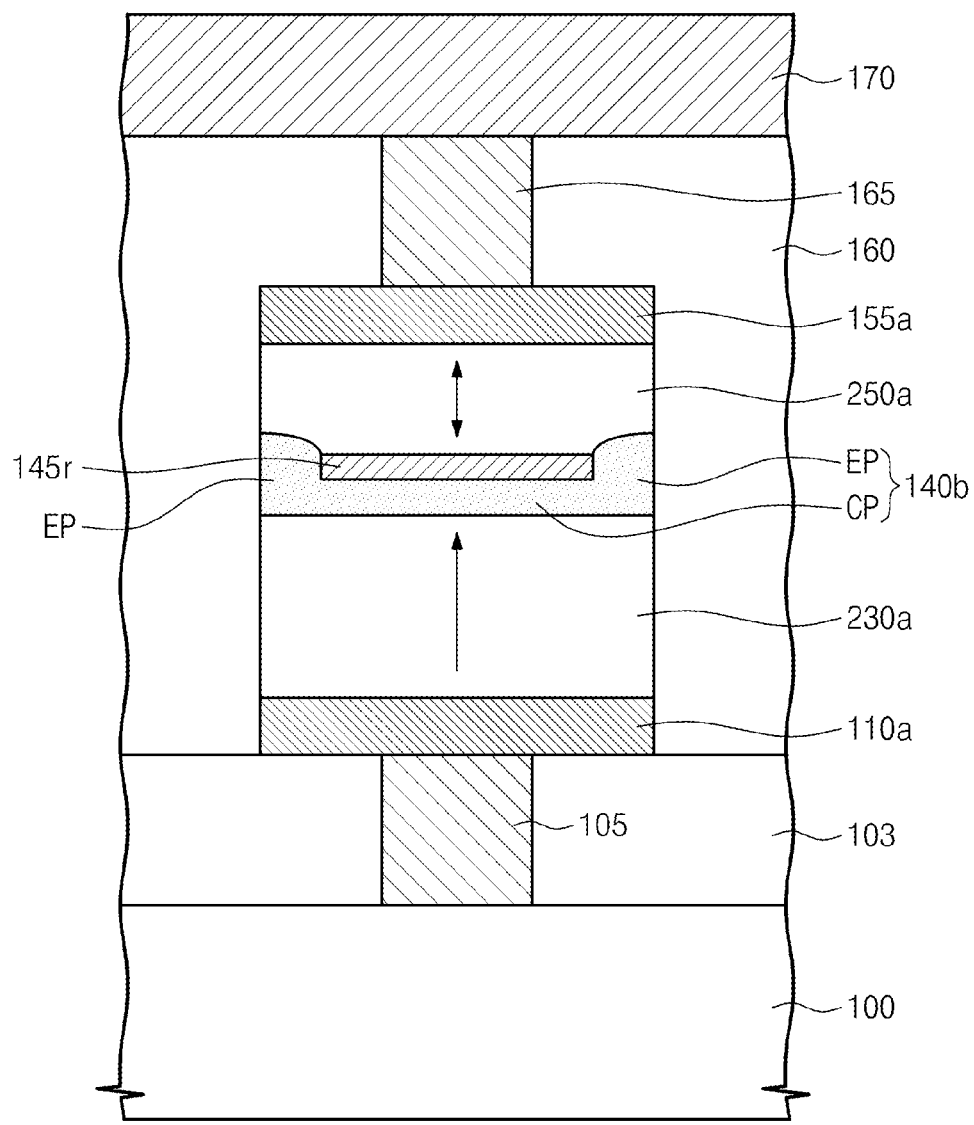
FIG. 3 is a cross sectional view illustrating another modified embodiment of a magnetic memory device according to an embodiment of the inventive concept.

FIG. 3 is a cross sectional view illustrating another modified embodiment of a magnetic memory device according to an embodiment of the inventive concept.

Referring to FIG. 3, a reference perpendicular magnetic pattern 230a, the tunnel barrier pattern 140b and a free perpendicular magnetic pattern 250a may be sequentially stacked on the first electrode 110a. The second electrode 155a may be disposed on the free perpendicular magnetic pattern 250a.

The reference perpendicular magnetic pattern 230a may have a fixed magnetization direction in one direction. The fixed magnetization direction of the reference magnetic pattern 230a may be substantially perpendicular to the bottom surface of the tunnel barrier pattern 140b. A magnetization direction of the free perpendicular magnetic pattern 250a may be configured to be switchable between parallel to and anti-parallel to the fixed magnetization direction of the reference perpendicular magnetic pattern 230a. The magnetization direction of the free perpendicular magnetic pattern 250a may also be substantially perpendicular to the bottom surface of the tunnel barrier pattern 140b.

The reference perpendicular magnetic pattern 230a may have a first critical current density, and the free perpendicular magnetic pattern 250a may have a second critical current density. The first critical current density may be a minimum current density to change the magnetization direction of the reference perpendicular magnetic pattern 230a. The second critical current density may be a minimum current density to change the magnetization direction of the free perpendicular magnetic pattern 250a. The first critical current density of the reference perpendicular magnetic pattern 230a may be more than the second critical current density of the free perpendicular magnetic pattern 250a. A program current density for changing the magnetization direction of the free perpendicular magnetic pattern 250a may be less than the first critical current density and more than the second critical current density. Therefore, the magnetization direction of the reference perpendicular magnetic pattern 230a may be fixed, and the magnetization direction of the free perpendicular magnetic pattern 250a may be changed by a program operation using the program current density.

In an embodiment, the reference perpendicular magnetic pattern 230a may be thicker than the free perpendicular magnetic pattern 250a, so that the first critical current density may be more than the second critical current density. Additionally or alternatively, a coercive force of the reference perpendicular magnetic pattern 230a may be greater than a coercive force of the free perpendicular magnetic pattern 250a, so that the first critical current density may be more than the second critical current density.

For example, the reference perpendicular magnetic pattern 230a may include at least one of a perpendicular magnetic material and a perpendicular magnetic structure. The perpendicular magnetic material may include at least one of CoFeTb, CoFeGd, FePt of an $L1_0$ structure, FePd of an $L1_0$ structure, CoPd of an $L1_0$ structure, CoPt of an $L1_0$ structure, or CoPt of a Hexagonal Close Packed lattice (HCP) structure. The perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n (where n is the number of stacked layers). The free perpendicular magnetic pattern 250a may include at least one of a perpendicular magnetic material (e.g., CoFeTb, CoFeGd, FePt of an Ll$_o$ structure, FePd of an $L1_0$ structure, CoPd of an $L1_0$ structure, CoPt of an $L1_0$ structure, and/or CoPt of a HCP structure) and a perpendicular magnetic structure (e.g., (Co/Pt)n, (CoFe/Pt)n, (CoFe/Pd)n, (Co/Pd)n, (Co/Ni)n, (CoNi/Pt)n, (CoCr/Pt)n and/or (CoCr/Pd)n, where n is the number of stacked layers). In this case, the reference and free perpendicular magnetic patterns 230a and 250a may be formed to have the first critical current density and the second critical current density, respectively.

The residual capping pattern 145r may be interposed between the top surface of the central portion CP of the tunnel barrier pattern 140b and the free perpendicular magnetic pattern 250a. The residual capping pattern 145r may be in contact with the top surface of the central portion CP and a bottom surface of the free perpendicular magnetic pattern 250a.

Figure 4:
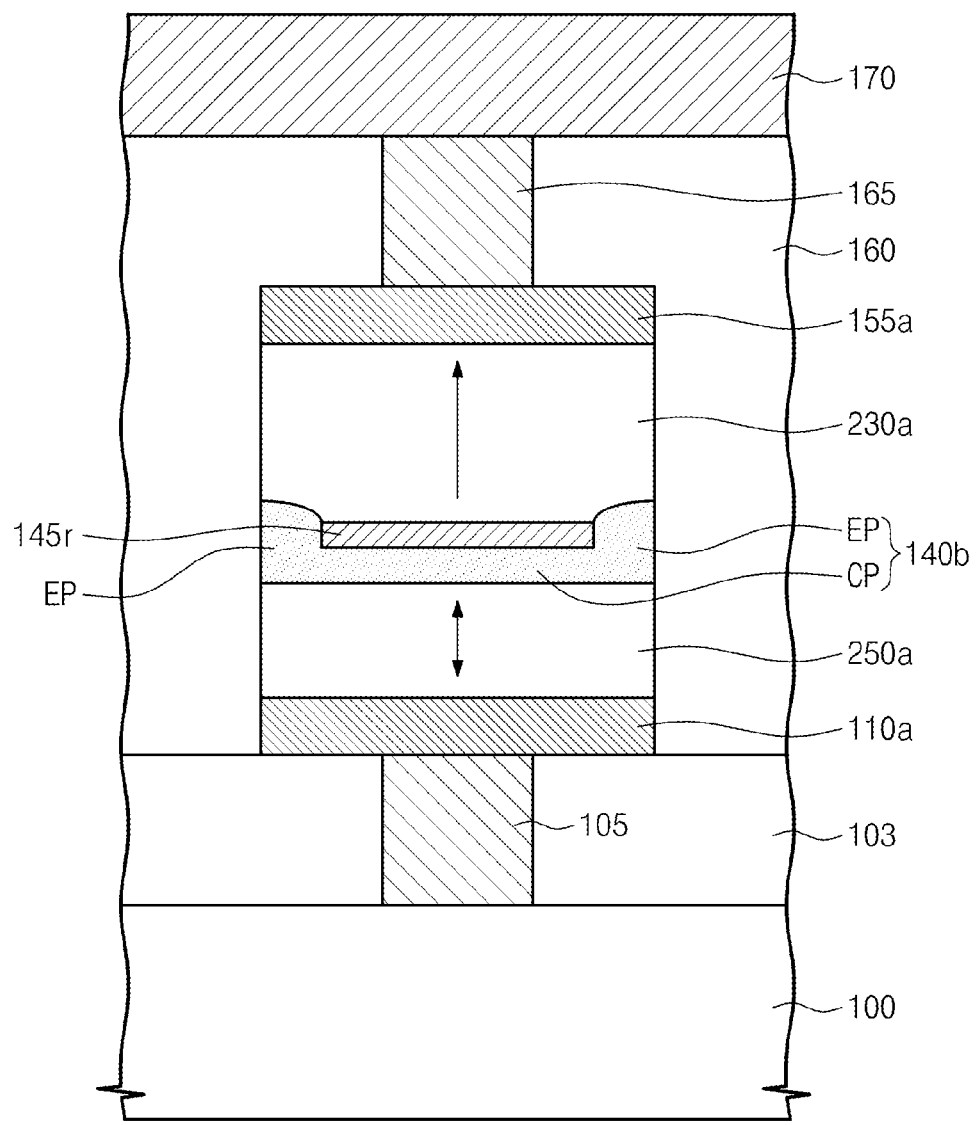
FIG. 4 is a cross sectional view illustrating still another modified embodiment of a magnetic memory device according to an embodiment of the inventive concept.

FIG. 4 is a cross sectional view illustrating still another modified embodiment of a magnetic memory device.

Referring to FIG. 4, the free perpendicular magnetic pattern 250a, tunnel barrier pattern 140b and reference perpendicular magnetic pattern 230a may be sequentially stacked on the first electrode 110a. That is, the free perpendicular magnetic pattern 250a may be disposed under the bottom surface of the tunnel barrier pattern 140b, and the reference perpendicular magnetic pattern 230a may be disposed overlying the top surface of the tunnel barrier pattern 140b.

In the present modified embodiment, the residual capping pattern 145r may be interposed between the top surface of the central portion CP of the tunnel barrier pattern 140b and a bottom surface of the reference perpendicular magnetic pattern 230a. The residual capping pattern 145r may be in contact with the top surface of the central portion CP and the bottom surface of the reference perpendicular magnetic pattern 230a. In the present modified embodiment, the second electrode 155a may be disposed on a top surface of the reference perpendicular magnetic pattern 230a.

Methods of fabricating magnetic memory devices according to embodiments of the inventive concept will now be described with reference to the accompanying drawings.

FIGS. 5 to 9 are cross sectional views illustrating a method of fabricating a magnetic memory device according to an embodiment of the inventive concept.

Figure 5:
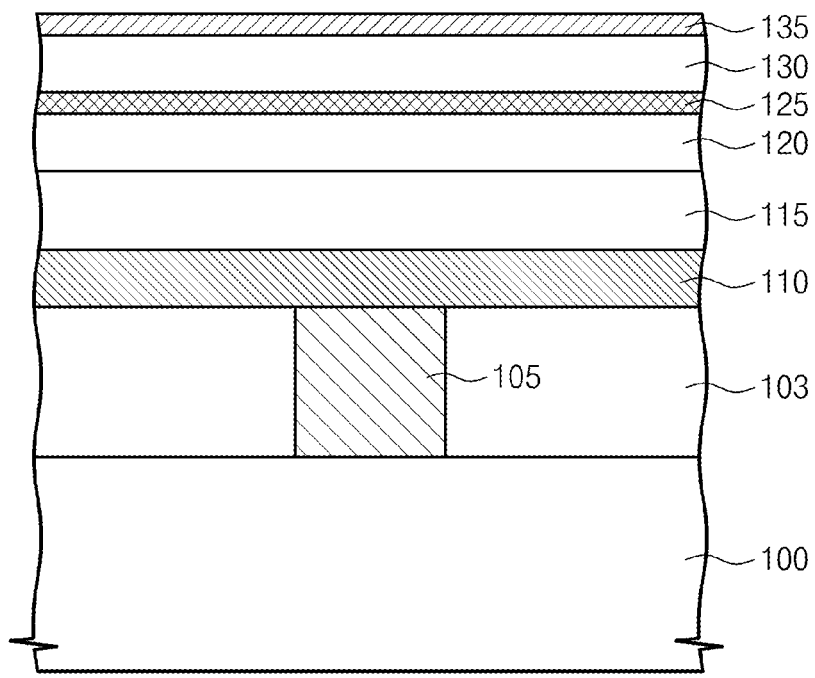
FIGS. 5 to 9 are cross sectional views illustrating a method of fabricating a magnetic memory device according to an embodiment of the inventive concept.

Referring to FIG. 5, a lower interlayer dielectric 103 may be formed on a substrate 100. A lower contact plug 105 may be formed to penetrate the lower interlayer dielectric 103.

A first conductive layer 110, a pinning layer 115, a reference supplementary magnetic layer 120 and an exchange coupling layer 125 may be sequentially formed on the lower interlayer dielectric 103. A reference magnetic layer 130 may be formed on the exchange coupling layer 125. The first conductive layer 110 may be formed of a conductive metal nitride such as titanium nitride and/or tantalum nitride. The pinning layer 115 may be formed of an anti-ferromagnetic material such as PtMn, IrMn, MnO, MnS, MnTe and/or MnF. The reference supplementary magnetic layer 120 may be formed of a ferromagnetic material such as CoFeB, CoFe, NiFe and/or CoFeNi. The exchange coupling layer 125 may be formed of a rare transition metal such as Ru, Jr and/or Rh. The reference magnetic layer 130 may be formed of a ferromagnetic material such as CoFeB, CoFe, NiFe and/or CoFeNi.

A base-metal layer 135 may be formed on the reference magnetic layer 130. The base-metal layer 135 may include at least one of magnesium (Mg), aluminum (Al), titanium (Ti) and magnesium-zinc (Mg—Zn).

Figure 6:
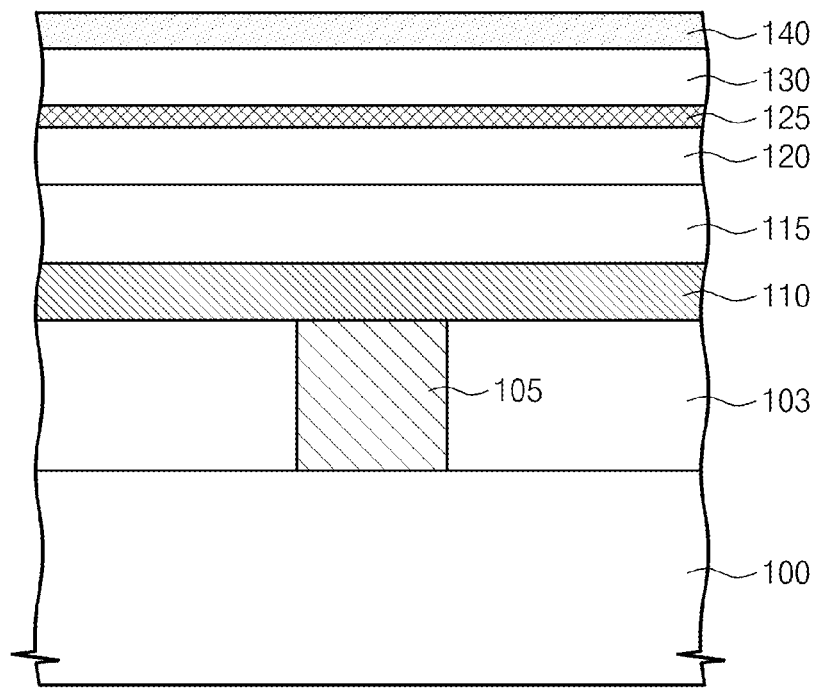

Referring to FIG. 6, a first oxidation process may be performed to the base-metal layer 135, so that the base-metal layer 135 may be oxidized to form a base-barrier layer 140. The base-barrier layer 140 may be formed of metal oxide. For example, the base-barrier layer 140 may include at least one of magnesium oxide, aluminum oxide, titanium oxide and/or magnesium-zinc oxide. In an embodiment, substantially the entire base-metal layer 135 may be oxidized. The first oxidation process may be performed by a thermal oxidation process, a plasma oxidation process and/or a thermal/plasma oxidation process.

Alternatively, the base-barrier layer 140 may be formed by other suitable methods. For example, the base-barrier layer 140 may be formed on the reference magnetic layer 130 using at least one of a chemical vapor deposition (CVD) process and an atomic layer deposition (ALD) process. In this case, the base-barrier layer 140 may also be formed of a metal oxide such as magnesium oxide, aluminum oxide layer, titanium oxide and/or magnesium-zinc oxide.

The base-barrier layer 140 may be formed to have substantially uniform thickness. In an embodiment, the base-barrier layer 140 may have a thickness in a range of about 1 angstrom to about 10 angstrom, however, the inventive concept is not limited thereto.

Figure 7:
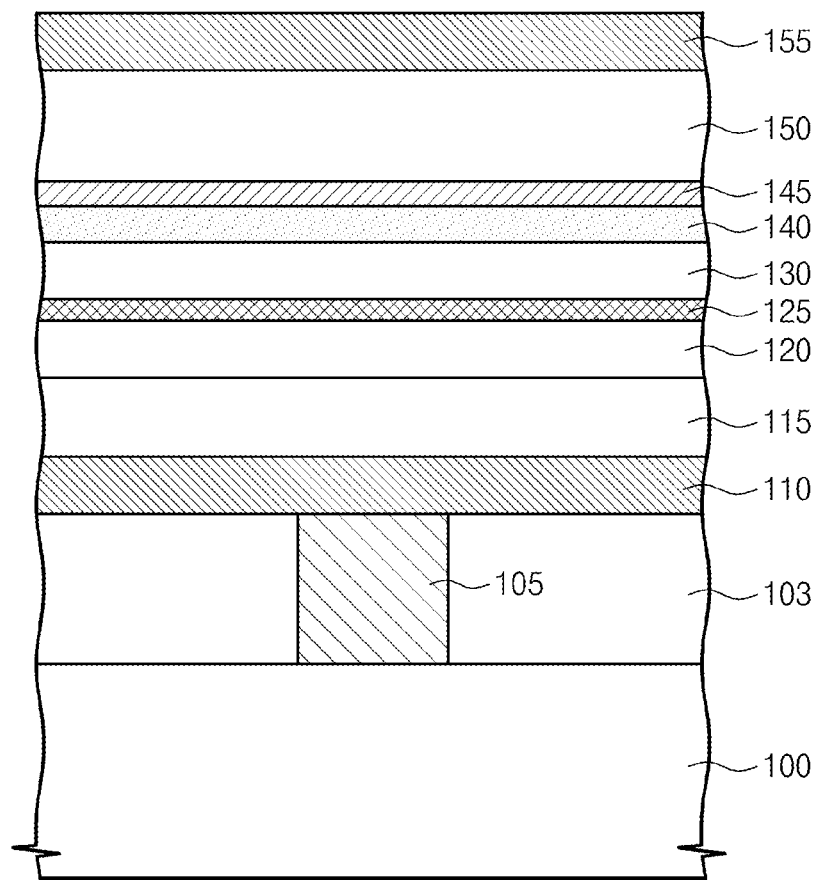

Referring to FIG. 7, a capping layer 145 may be formed on the base-barrier layer 140. The capping layer 145 may include metal. For example, the capping layer 145 may be a metal layer. In an embodiment, the metal in the capping layer 145 may be the same as a metal in the base-barrier layer 140. For example, the capping layer 145 may include at least one of magnesium (Mg), aluminum (Al), titanium (Ti) and magnesium-zinc (Mg—Zn). The capping layer 145 may be formed directly on the base-barrier layer 140.

A free magnetic layer 150 and a second conductive layer 155 may be sequentially formed on the capping layer 145. The free magnetic layer 150 may be formed of a ferromagnetic material such as CoFeB, CoFe, NiFe and/or CoFeNi. The second conductive layer 155 may be formed of a conductive metal nitride such as titanium nitride and/or a tantalum nitride.

Figure 8:
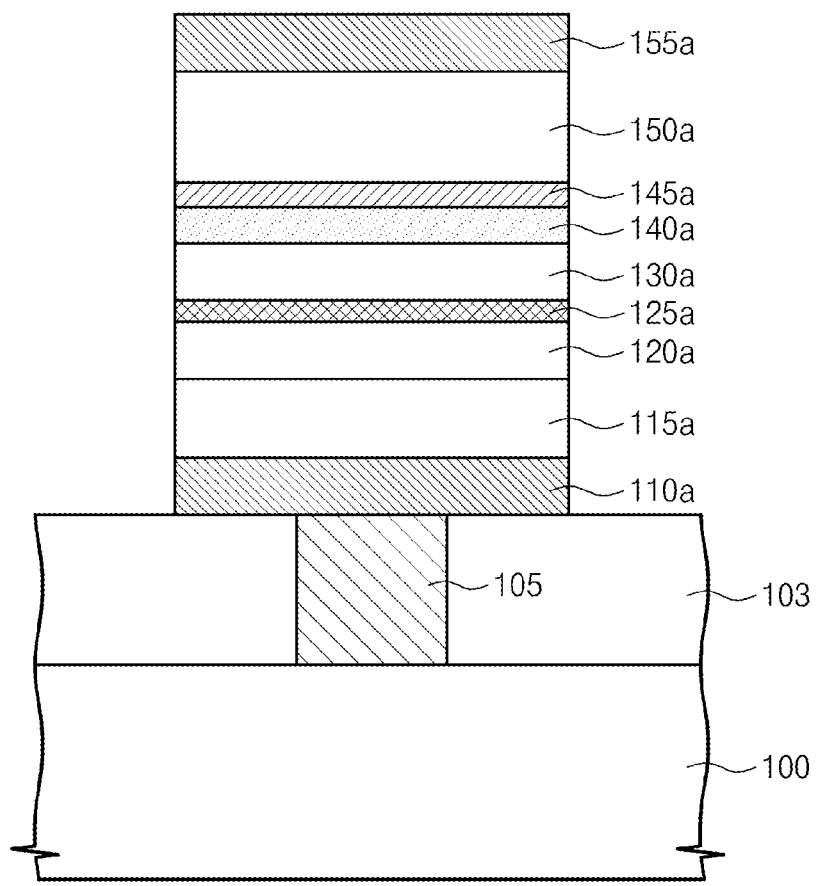
Figure 9:
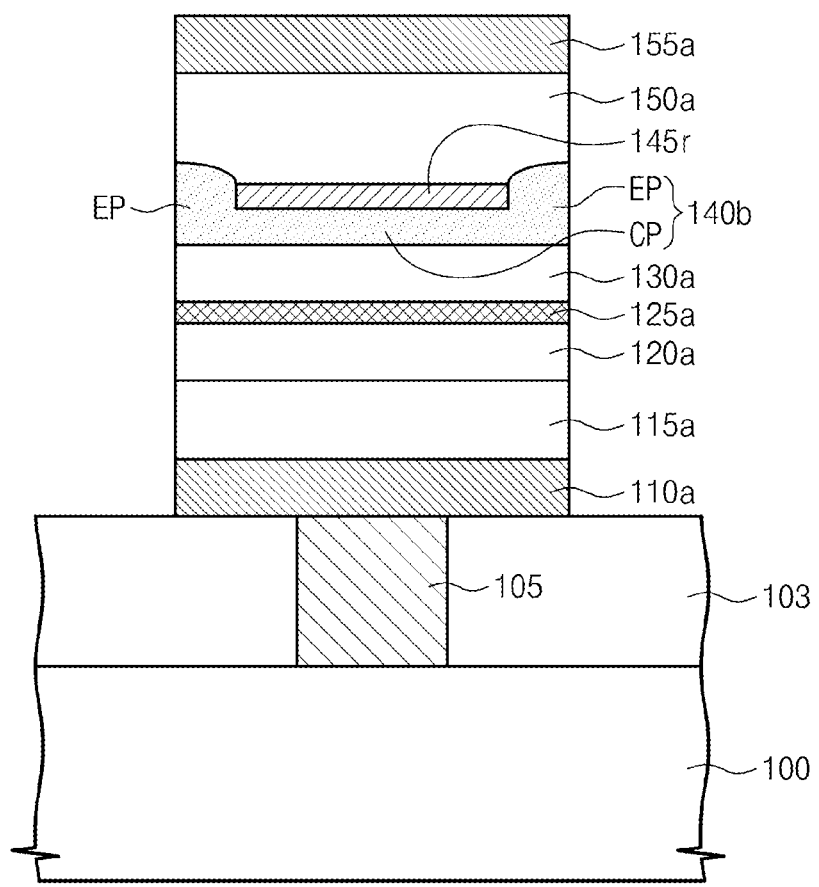

Referring to FIGS. 8 and 9, the second conductive layer 155, free magnetic layer 150, capping layer 145, base-barrier layer 140, reference magnetic layer 130, exchange coupling layer 125, reference supplementary magnetic layer 120, pinning layer 115 and first conductive layer 110 may be successively patterned to form a first electrode 110a, pinning pattern 115a, reference supplementary magnetic pattern 120a, exchange coupling pattern 125a, reference magnetic pattern 130a, base-barrier pattern 140a, capping pattern 145a, free magnetic pattern 150a and second electrode 155a sequentially stacked on the lower interlayer dielectric. The patterns 110a, 115a, 120a, 125a, 130a, 140a, 145a, 150a and 155a may have sidewalls being self-aligned to each other.

A second oxidation process may be performed to the capping pattern 145a, so that an edge portion of the capping pattern 145a may be oxidized to form a tunnel barrier pattern 140b illustrated in FIG. 9. A central portion of the capping pattern 145a may remain without being oxidized. That is, the central portion of the capping pattern 145a may not be oxidized. Thus, after performing the second oxidation process, a residual capping pattern 145r may be formed. The second oxidation process may be performed by a thermal oxidation process, a plasma oxidation process and/or a thermal/plasma oxidation process, for example.

The tunnel barrier pattern 140b may include the base-barrier pattern 140a and the oxidized edge portion of the capping pattern 145a. As a result, as further illustrated in FIG. 9, the tunnel barrier pattern 140b can include a central portion CP and an edge portion EP that is thicker than the central portion CP. The residual capping pattern 145r may be disposed on the central portion CP of the tunnel barrier pattern 140b. The central portion CP of the tunnel barrier pattern 140b may correspond to a central portion of the base-barrier pattern 140a. The edge portion EP of the tunnel barrier pattern 140b may include an edge portion of the base-barrier pattern 140a and the oxidized edge portion of the capping pattern 145a. Since the capping pattern 145a may include the same metal as the metal in the base-barrier pattern 140a, the oxidized edge portion of the capping pattern 145a may include the same metal oxide as the base-barrier pattern 140a.

In an embodiment, since the edge portion EP of the tunnel barrier pattern 140b is formed by the second oxidation process, the top surface of the edge portion EP of the tunnel barrier pattern 140b may be disposed at a level higher than the top surface of the residual capping pattern 145r.

Next, the upper interlayer dielectric 160, the upper contact plug 165 and the interconnection 170 in FIG. 1 may be formed in that order.

According to the fabrication methods described above, the capping layer 145 may be formed on the base-barrier layer 140, and then the layers 145 and 140 may be patterned to form the base-barrier pattern 140a and the capping pattern 145a. The edge portion of the capping pattern 145a may be oxidized to form the tunnel barrier pattern 140b. The central portion of the capping pattern 145a remains without being oxidized to form the residual capping pattern 145r. As a result, the tunnel barrier pattern 140b having the edge portion EP thicker than the central portion CP may be realized.

Next, methods of fabricating the magnetic memory device illustrated in FIG. 2 will be described.

Figure 10:
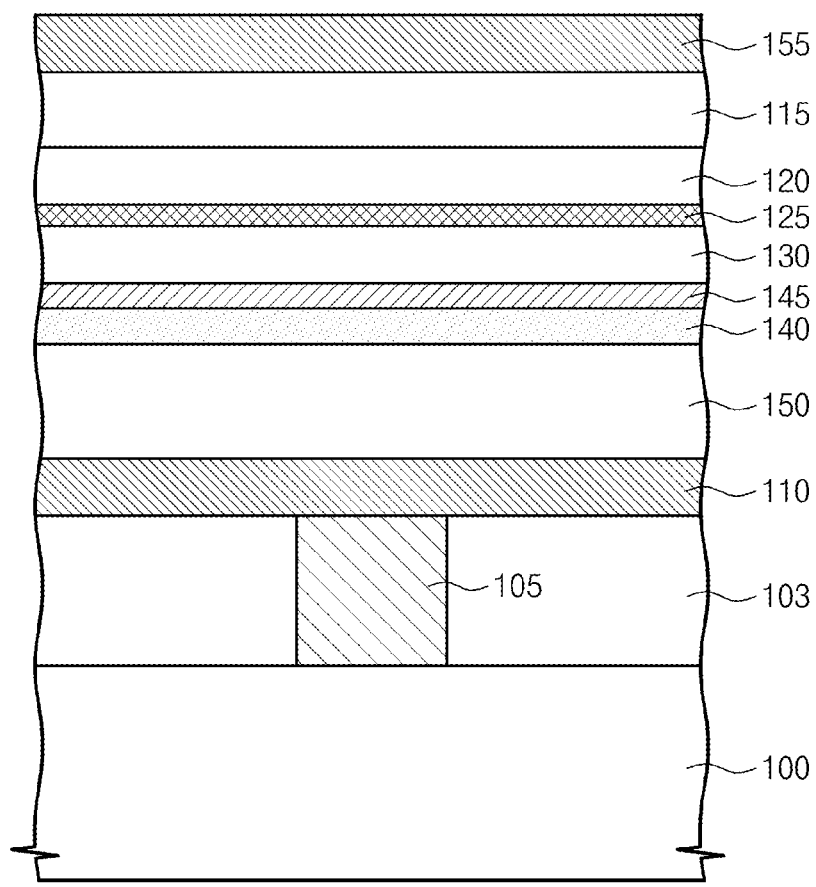
FIGS. 10 to 12 are cross sectional views illustrating a modified embodiment of a method of fabricating a magnetic memory device according to an embodiment of the inventive concept.
Figure 11:
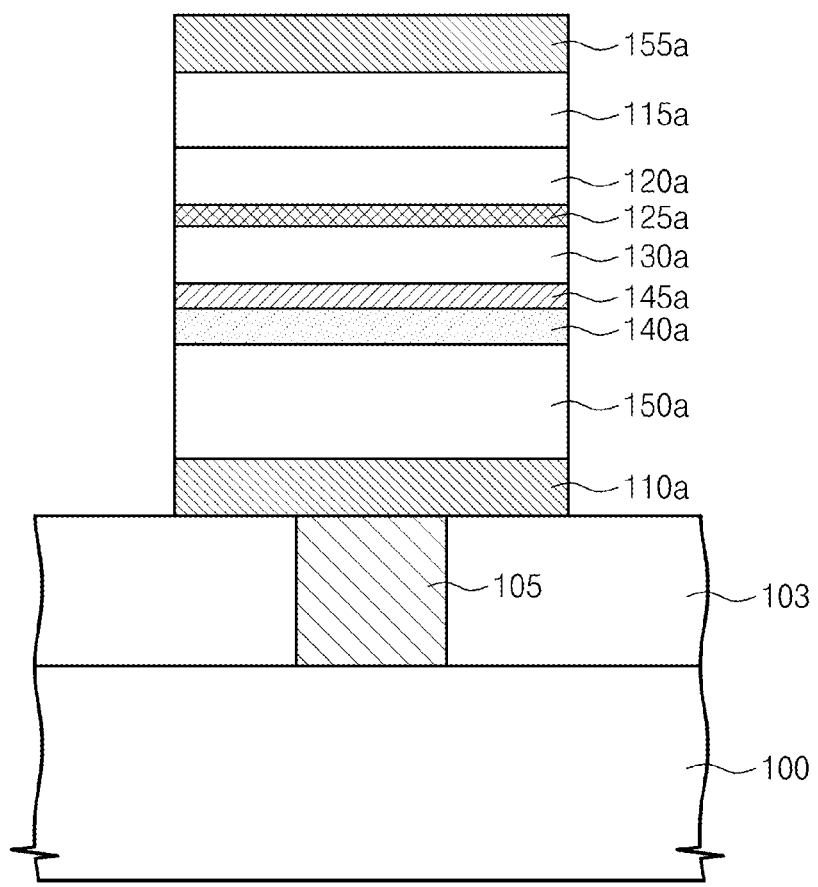
Figure 12:
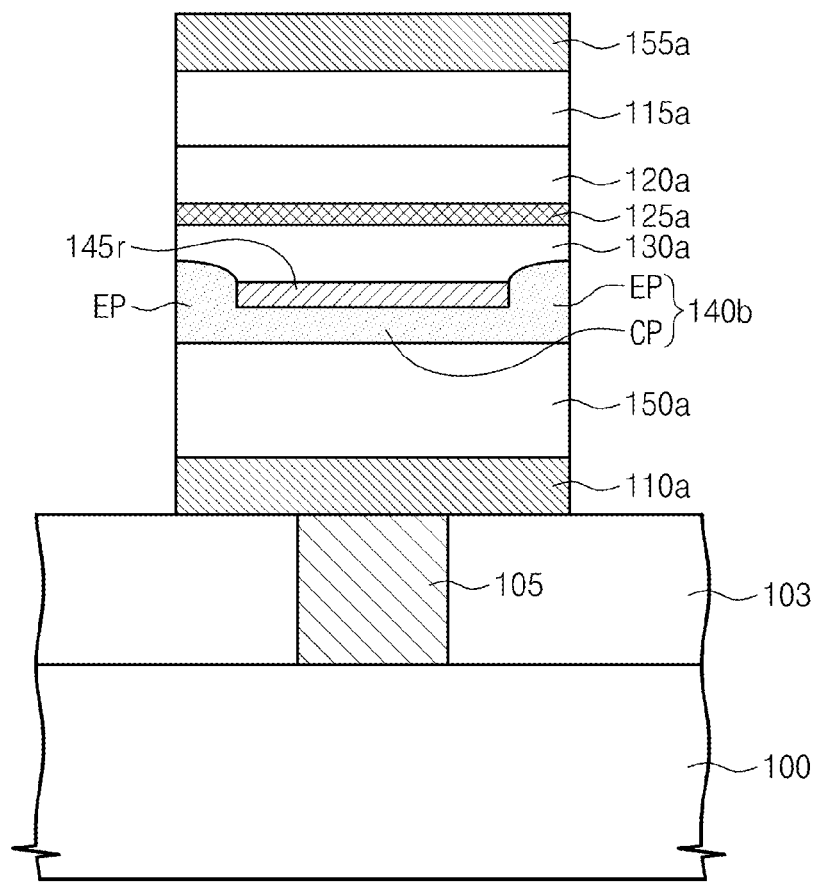

FIGS. 10 to 12 are cross sectional views illustrating a modified embodiment of a method of fabricating a magnetic memory device.

Referring to FIG. 10, a first conductive layer 110, a free magnetic layer 150 and a base-barrier layer 140 may be sequentially formed on the lower interlayer dielectric 103. As described with reference to FIGS. 5 and 6, the base-barrier layer 140 may be formed by forming the base-metal layer 135 and performing the first oxidation process. Or the base-barrier layer 140 may be formed using the CVP process and/or the ALD process.

A capping layer 145 may be formed on the base-barrier layer 140. A reference magnetic layer 130, an exchange coupling layer 125, a reference supplementary magnetic layer 120, a pinning layer 115 and second conductive layer 155 may be sequentially formed on the capping layer 145.

Referring to FIG. 11, the second conductive layer 155, pinning layer 115, reference supplementary magnetic layer 120, exchange coupling layer 125, reference magnetic layer 130, capping layer 145, the base-barrier layer 140, free magnetic layer 150 and first conductive layer 110 may be successively patterned to form the first electrode 110a, free magnetic pattern 150a, base-barrier pattern 140a, capping pattern 145a, reference magnetic pattern 130a, exchange coupling pattern 125a, reference supplementary magnetic pattern 120a, pinning pattern 115a and second conductive pattern 155a that may be sequentially stacked on the lower interlayer dielectric 103.

Referring to FIG. 12, an edge portion of the capping pattern 145a may be oxidized to form the tunnel barrier pattern 140b. A central portion of the capping pattern 145a may not be oxidized. Thus, the residual capping pattern 145r may be defined between the bottom surface of the reference magnetic pattern 130a and the top surface of the central portion CP of the tunnel barrier pattern 140b. The residual capping pattern 145r corresponds to the central portion of the capping pattern 140a which is not oxidized. Next, the upper interlayer dielectric 160, upper contact plug 165 and interconnection 170 illustrated in FIG. 2 may be formed in the order named.

Next, methods of fabricating the magnetic device illustrated in FIG. 3 will be described.

Figure 13:
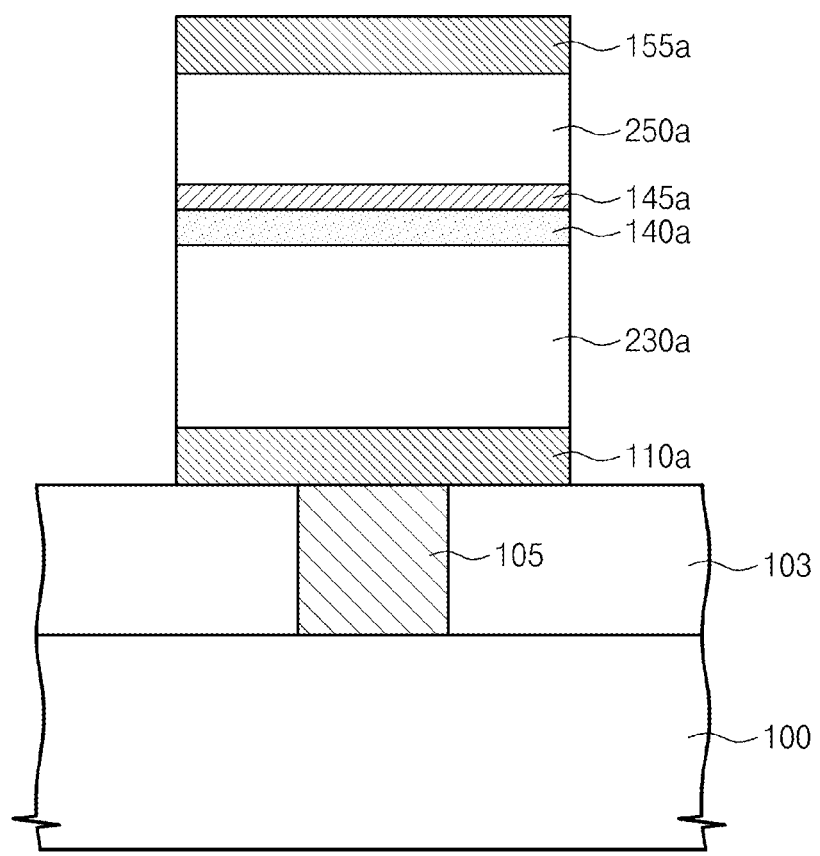
FIGS. 13 and 14 are cross sectional views illustrating another modified embodiment of a method of fabricating a magnetic memory device according to an embodiment of the inventive concept.
Figure 14:
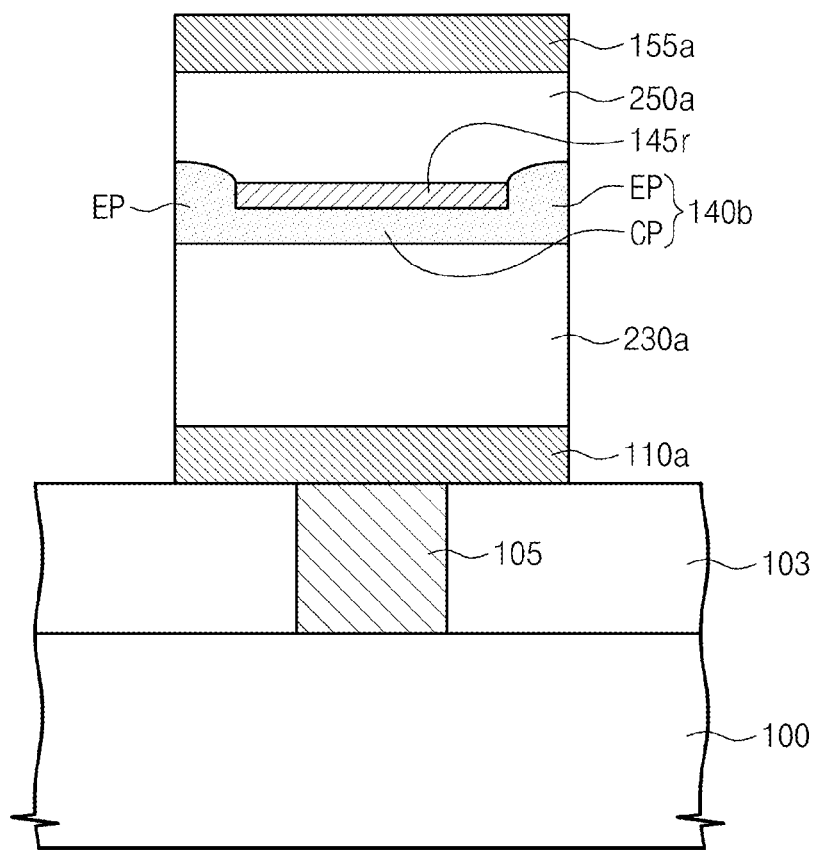

FIGS. 13 and 14 are cross sectional views illustrating another modified embodiment of a method of fabricating a magnetic device.

Referring to FIG. 13, a first conductive layer, a reference perpendicular magnetic layer, a base-barrier layer, a capping layer, a free perpendicular magnetic layer and a second conductive layer (not illustrated) may be sequentially formed on the lower interlayer dielectric 103. The reference perpendicular magnetic layer may be thicker than the free perpendicular magnetic layer, and/or a coercive force of the reference perpendicular magnetic layer may be greater than a coercive force of the free perpendicular magnetic layer. The reference perpendicular magnetic layer may include at least one of the perpendicular magnetic material or the perpendicular magnetic structure as described with reference to FIG. 3. Also, the free perpendicular magnetic layer may include at least one of the perpendicular magnetic material or the perpendicular magnetic structure.

The second conductive layer, free perpendicular magnetic layer, capping layer, base-barrier layer, reference perpendicular magnetic layer and first conductive layer may be successively patterned to form a first electrode 110a, a reference perpendicular magnetic pattern 230a, a base-barrier pattern 140a, a capping pattern 145a, a free perpendicular magnetic pattern 250a and a second electrode 155 sequentially stacked on the lower interlayer dielectric 103.

Referring to FIG. 14, an edge portion of the capping pattern 145a may be oxidized to form the tunnel barrier pattern 140b. A central portion of the capping pattern 145a may not be oxidized. Thus, a residual capping pattern 145r may be formed between the top surface of the central portion CP of the tunnel barrier pattern 140b and the bottom surface of the free perpendicular magnetic pattern 250a. The upper interlayer dielectric 160, upper contact plug 165 and interconnection 170 illustrated in FIG. 3 may be formed in that order.

Next, methods of fabricating the magnetic device illustrated in FIG. 4 will be described.

Figure 15:
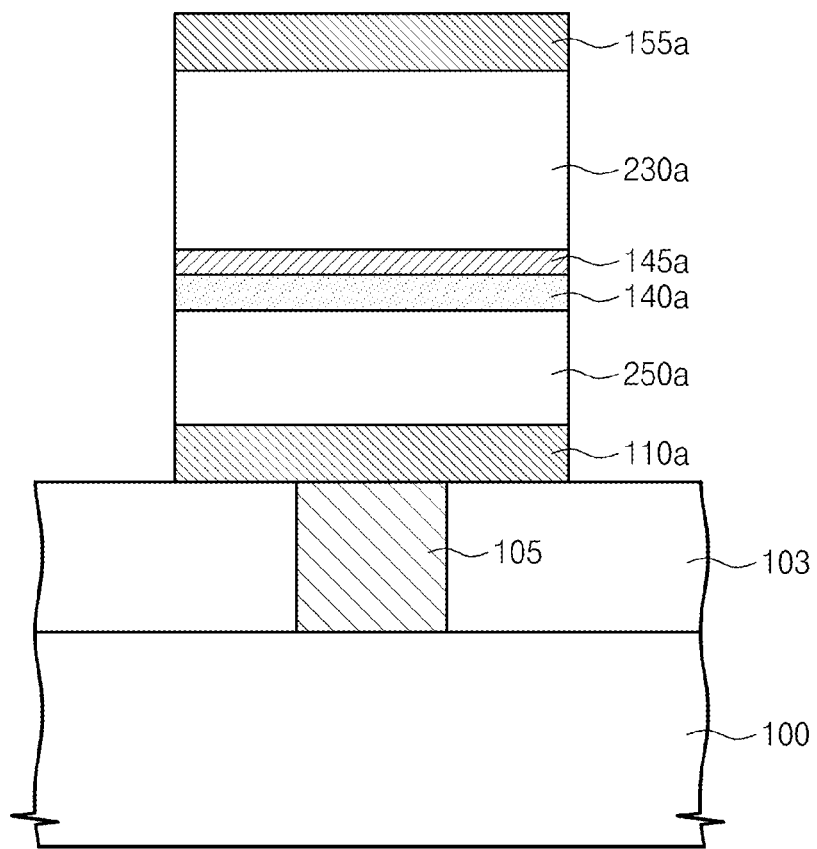
FIGS. 15 and 16 are cross sectional views illustrating still another modified embodiment of a method of fabricating a magnetic memory device according to an embodiment of the inventive concept.
Figure 16:
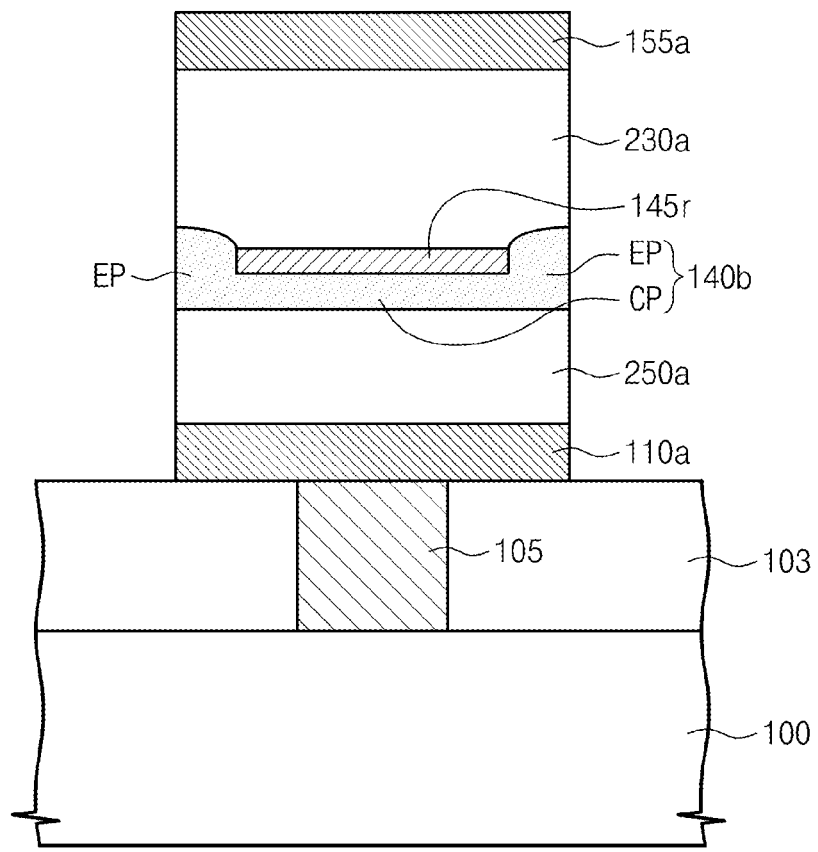

FIGS. 15 and 16 are cross sectional views illustrating still another modified embodiment of a method of fabricating a magnetic memory device according to an embodiment of the inventive concept.

Referring to FIG. 15, a first conductive layer, free perpendicular magnetic layer, base-barrier layer, capping layer, reference perpendicular magnetic layer and second conductive layer (not illustrated) may be sequentially formed on the lower interlayer dielectric 103. The second conductive layer, reference perpendicular magnetic layer, capping layer, base-barrier layer, free perpendicular magnetic layer and first conductive layer may be successively patterned to form a first electrode 110a, a free perpendicular magnetic pattern 250a, a base-barrier pattern 140a, a capping pattern 145a, a reference perpendicular magnetic pattern 230a and a second electrode 155a sequentially stacked on the lower interlayer dielectric 103.

Referring to FIG. 16, an edge portion of the capping pattern 145a may be oxidized to the tunnel barrier pattern 140b. A central portion of the capping pattern 145a may not be oxidized. A residual capping pattern 145r may be formed between the top surface of the central portion CP of the tunnel barrier pattern 140b and the bottom surface of the reference perpendicular magnetic pattern 230a. Next, the upper interlayer dielectric 160, upper contact plug 165 and interconnection 170 illustrated in FIG. 4 may be formed in that order.

The magnetic devices described above may be encapsulated using various packaging techniques. For example, the magnetic devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the magnetic device, e.g., the magnetic memory device according to one of the above embodiments is mounted may further include at least one semiconductor device (e.g., a controller, a memory device and/or a hybrid device) having a different function from the magnetic device.

According to embodiments of the inventive concepts, the edge portion of the tunnel barrier pattern may be thicker than the central portion of the tunnel barrier pattern. Therefore, the amount of electrons passing through the edge portion of the tunnel barrier pattern can be minimized or substantially reduced. As a result, the magnetic memory device having improved reliability may be realized. Also, a tunneling area of the electrons may be substantially limited to the central portion of the tunnel barrier pattern, so that the program current density may be minimized or substantially reduced. As a result, a magnetic memory device having lower power consumption and/or increased integration density can be realized.

In some embodiments, the edge portion of the tunnel barrier pattern may be made thicker than the central portion of the tunnel barrier pattern by methods different from the methods described above, e.g., without oxidizing the capping pattern as discussed above. For example, after forming the tunnel barrier pattern having a substantially uniform thickness, the thickness of the central portion of the tunnel barrier pattern may be reduced using conventional methods while leaving edge portions of the tunnel barrier pattern without reducing the thickness.

The principles of the present disclosure can be also applied to in-plane, perpendicular, or combinations of in-plane and perpendicular magnetic devices, e.g., in-plane spin transfer torque (STT)-RAM devices such as devices in which the free magnetic pattern or free layer has a high perpendicular anisotropy while the equilibrium magnetic moment of the free magnetic pattern remains in-plane. In some embodiments, the net moment of the MTJ pattern may have components in plane and perpendicular-to-plane. As used herein, "in-plane" is substantially within or parallel to the plane of one or more of the layers of a MTJ pattern. Conversely, "perpendicular" corresponds to a direction that is substantially perpendicular to one or more of the layers of the MTJ pattern.

The principles of the present disclosure may be applied to a variety of other magnetic element or magnetic multilayer structures. A single MTJ or dual MTJ are, therefore, only some examples of such structures. For example, the principles of the present disclosure may also be applied to any magnetic element having a spin valve, e.g., spin valve STT-MRAM having conductive spacer layers formed of a conductive material such as CR, Ta, Ti, W, and Ru, one example of which is shown in U.S. Pat. No. 7,821,088, the contents of which are incorporated herein by reference in their entirety. In addition, the present disclosure can be applied to a ballistic magnetoresistance structure. Also, the principles of the present disclosure may be applied to spin logic devices. The spin logic devices may be, for example, all-spin logic (ASL) device and non-volatile spin logic device.

In some embodiments, the principles of the present disclosure may be applied to system on chip, in which the above described MTJ pattern may be integrated on the same die as a process or application-specific integrated circuit (ASIC) and electrically coupled thereto.

Figure 17:
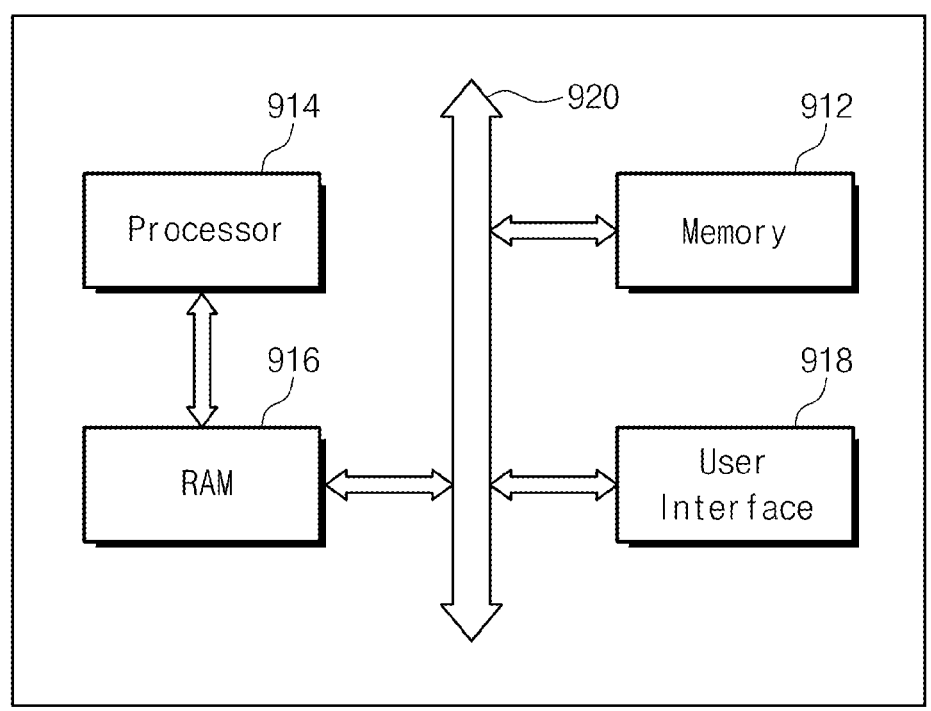
FIG. 17 is a schematic view of an electronic system in which a magnetic device according to some embodiments of the inventive concept is employed.

FIG. 17 is a schematic view of an electronic system 900 in which the magnetic device according to embodiments of the inventive concept discussed above is used. The electronic system 900 may be used for a mobile telecommunication device or a computer such as a portable notebook computer, Ultra-Mobile PCs (UMPC), and Tablet PCs. For example, the electronic system 900 may include a memory system 912, a processor 914, RAM 916, and a user interface 918, which may execute data communication using a bus 920. The processor 914 may be a microprocessor or a mobile processor (AP). The processor 914 may have a processor core (not illustrated) that can include a floating point unit (FPU), an arithmetic logic unit (ALU), and a digital signal processing core (DSP Core), or any combinations thereof. The processor 914 may execute the program and control the electronic system 900. The RAM 916 may be used as an operation memory of the processor 914. For example, the RAM 916 may include a magnetic pattern or device according to example embodiments. Alternatively, the processor 914 and the RAM 916 may be packaged in a single package body. The user interface 918 may be used in inputting/outputting data to/from the electronic system 900. The memory system 912 may store codes for operating the processor 914, data processed by the processor 914, or externally input data. The electronic system 900 may be used for a variety of electronic devices.

Various operations may be described as multiple discrete steps performed in a manner that is most helpful in understanding the invention. However, the order in which the steps are described does not imply that the operations are order-dependent or that the order that steps are performed must be the order in which the steps are presented.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and one or more to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Throughout the specification, features shown in one embodiment may be incorporated in other embodiments within the spirit and scope of the inventive concept.

Reference throughout this specification to "one embodiment" "some embodiments" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and should not be restricted or limited by the foregoing description.

What is claimed is:

1. A magnetic device comprising:
   a first magnetic pattern and a second magnetic pattern disposed on a substrate;
   a tunnel barrier pattern interposed between the first magnetic pattern and the second magnetic pattern; and
   a residual capping pattern interposed between a central portion of the tunnel barrier pattern and the second magnetic pattern,
   wherein an edge portion of the tunnel barrier pattern is thicker than the central portion of the tunnel barrier pattern, wherein the central portion of the tunnel barrier pattern has a substantially uniform thickness, and
   wherein a lower surface of the second magnetic pattern contacts with an upper surface of the residual capping pattern and an upper surface of the edge portion of the tunnel barrier pattern.

2. The magnetic device of claim 1, wherein the residual capping pattern is made of metal and the tunnel barrier pattern includes metal oxide.

3. The magnetic device of claim 2, wherein the metal oxide in the tunnel barrier pattern includes the same metal as the residual capping pattern.

4. The magnetic device of claim 1, wherein the first magnetic pattern, the tunnel barrier pattern and the second magnetic pattern are sequentially stacked;
   a top surface of the edge portion of the tunnel barrier pattern is disposed at a level higher than a top surface of the central portion of the tunnel barrier pattern; and
   a bottom surface of the edge portion of the tunnel barrier pattern is substantially coplanar with a bottom surface of the central portion of the tunnel barrier pattern.

5. The magnetic device of claim 1, wherein a maximum thickness of the edge portion of the tunnel barrier pattern is equal to or less than about five times a thickness of the central portion of the tunnel barrier pattern.

6. The magnetic device of claim 1, wherein one of the first and second magnetic patterns has a fixed magnetization direction in one direction; and
   wherein the other of the first and second magnetic patterns has a magnetization direction switchable between parallel to and anti-parallel to the fixed magnetization direction.

7. The magnetic device of claim 6, wherein the magnetization directions of the first and second magnetic patterns are substantially parallel to a surface of the tunnel barrier pattern, which is adjacent to the first magnetic pattern.

8. The magnetic device of claim 6, wherein the magnetization directions of the first and second magnetic patterns are substantially perpendicular to a surface of the tunnel barrier pattern, which is adjacent to the first magnetic pattern.

9. A system on chip comprising:
   a processor; and
   a magnetic device electrically coupled to the processor, the memory device including: a first magnetic pattern and a second magnetic pattern disposed on a substrate;
   a tunnel barrier pattern interposed between the first magnetic pattern and the second magnetic pattern; and
   a residual capping pattern interposed between a central portion of the tunnel barrier pattern and the second magnetic pattern,
   wherein an edge portion of the tunnel barrier pattern is thicker than the central portion of the tunnel barrier pattern, wherein the central portion of the tunnel barrier pattern has a substantially uniform thickness, and
   wherein a lower surface of the second magnetic pattern contacts with an upper surface of the residual capping pattern and an upper surface of the edge portion of the tunnel barrier pattern.

10. A magnetic device comprising:
    a first magnetic pattern and a second magnetic pattern disposed on a substrate; and
    a tunnel barrier pattern interposed between the first magnetic pattern and the second magnetic pattern,
    wherein an edge portion of the tunnel barrier pattern is thicker than a central portion of the tunnel barrier pattern,
    wherein the central portion of the tunnel barrier pattern has a substantially uniform thickness, and
    wherein the width of the central portion comprises a majority of the width of the tunnel barrier pattern.

11. The magnetic device of claim 10, further comprising a residual capping pattern interposed between the central portion of the tunnel barrier pattern and the second magnetic pattern.

12. The magnetic device of claim 11, wherein a lower surface of the second magnetic pattern contacts with an upper surface of the residual capping pattern and an upper surface of the edge portion of the tunnel barrier pattern.

* * * * *